United States Patent
Dobson et al.

(10) Patent No.: US 6,174,823 B1
(45) Date of Patent: Jan. 16, 2001

(54) METHODS OF FORMING A BARRIER LAYER

(75) Inventors: Christopher David Dobson, Bristol; Mark Graeme Martin Harris, Newport; Keith Edward Buchanan, Whitebrook, all of (GB)

(73) Assignee: Trikon Equipments Limited, Newport Gwent (GB)

( * ) Notice: Under 35 U.S.C. 154(b), the term of this patent shall be extended for 0 days.

(21) Appl. No.: 08/975,705

(22) Filed: Nov. 21, 1997

(30) Foreign Application Priority Data

Nov. 22, 1996 (GB) .................................................. 9624343
Feb. 6, 1997 (GB) .................................................. 9702410
May 21, 1997 (GB) .................................................. 9710356
Jul. 22, 1997 (GB) .................................................. 9715282

(51) Int. Cl.$^7$ .................................................. H01L 21/31
(52) U.S. Cl. .......................... 438/778; 438/663; 438/664; 438/701; 438/760
(58) Field of Search .................................. 438/656, 664, 438/640, 653, 701, 760, 778, 663, 681

(56) References Cited

U.S. PATENT DOCUMENTS

| | | | |
|---|---|---|---|
| 4,701,349 | 10/1987 | Koyanagi et al. | 427/228 |
| 4,884,123 | 11/1989 | Dixit et al. | 357/71 |
| 5,136,362 | 8/1992 | Grief et al. | 357/67 |
| 5,202,152 | 4/1993 | Giannelis et al. | 427/108 |
| 5,290,731 | 3/1994 | Sugano et al. | 437/174 |
| 5,378,660 | 1/1995 | Ngan et al. | 437/247 |
| 5,395,461 | 3/1995 | Taki et al. | 148/208 |
| 5,419,787 | 5/1995 | Levi | 148/217 |
| 5,567,483 | 10/1996 | Foster et al. | 427/535 |
| 5,593,511 | * 1/1997 | Foster et al. | 148/238 |
| 5,851,364 | 12/1998 | Fu et al. | 204/142.3 |
| 5,858,184 | * 6/1995 | Fu et al. | 204/192.17 |
| 5,943,600 | * 3/1997 | Ngan et al. | 438/653 |

FOREIGN PATENT DOCUMENTS

| | | |
|---|---|---|
| 0 337 725 A2 | 10/1989 | (EP) . |
| 0 516 344 A1 | 12/1992 | (EP) . |
| 0 680 077 A1 | 12/1994 | (EP) . |
| 0 738 002 A2 | 10/1996 | (EP) . |
| 0 747 500 A1 | 12/1996 | (EP) . |
| 2 207 809 | 2/1989 | (GB) . |
| 2 207 809 | 8/1989 | (GB) . |
| WO 96/02938 | 2/1996 | (WO) . |
| WO 96/02939 | 2/1996 | (WO) . |

* cited by examiner

Primary Examiner—David Nelms
Assistant Examiner—Reneé R. Berry
(74) Attorney, Agent, or Firm—Jones Volentine, LLC

(57) ABSTRACT

This invention relates to methods of forming a barrier layer including depositing a layer of Titanium Nitride and subsequently nitriding the surface of that layer. In some embodiments the Titanium Nitride layer is exposed to Oxygen prior to the nitroding step.

19 Claims, 2 Drawing Sheets

Results In Order Of Barrier Strength

| Split | Ti (Å) | TiN (Å) | Vac-uum Break | Oxygen Anneal | Nit-trogen Anneal | Oxygen Plasma | NH3 Plasma | Furnace Bake | % Spik-ing |
|---|---|---|---|---|---|---|---|---|---|
| O₂ Furnace | 100 | 300 | YES | 450°C 45min | - | - | YES | 525°C 24hr | 0 |
| In-situ NH₃ | 100 | 300 | - | - | - | - | YES ‡ | 525°C 65hr | 10 |
| Vac. break NH₃ | 100 | 300 | YES | - | - | - | YES | 525°C 65hr | 50 |
| O₂ Plasma | 100 | 300 | - | - | - | 750 sccm 4min | YES | 525°C 65hr | 90 |
| N₂ Furnace | 100 | 300 | YES | - | 450°C 45min | - | - | 525°C 65hr | 100 |
| Ti, NH₃ TiN | 200 | 200 | - | - | - | - | YES * | 525°C 65hr | 100 |
| Control | 100 | 300 | - | - | - | - | - | 525°C 65hr | 100 |
| Ti, NH₃ | 400 | 0 | - | - | - | - | YES | 525°C 65hr | 100 |

\* NH₃ plasma between Ti and TiN steps.

‡ In situ means that there was no exposure to atmosphere prior to NH₃ plasma processing. Wafers are transported under vacuum.

Results In Order Of Barrier Strength

| Split | Ti (Å) | TiN (Å) | Vacuum Break | Oxygen Anneal | Nitrogen Anneal | Oxygen Plasma | NH3 Plasma | Furnace Bake | % Spiking |
|---|---|---|---|---|---|---|---|---|---|
| O2 Furnace | 100 | 300 | YES | 450°C 45min | – | – | YES | 525°C 24hr | 0 |
| In-situ NH3 | 100 | 300 | – | – | – | – | YES ‡ | 525°C 65hr | 10 |
| Vac. break NH3 | 100 | 300 | YES | – | – | – | YES | 525°C 65hr | 50 |
| O2 Plasma | 100 | 300 | – | – | – | 750 sccm 4min | YES | 525°C 65hr | 90 |
| N2 Furnace | 100 | 300 | YES | – | 450°C 45min | – | – | 525°C 65hr | 100 |
| Ti,NH3 TiN | 200 | 200 | – | – | – | – | YES * | 525°C 65hr | 100 |
| Control | 100 | 300 | – | – | – | – | – | 525°C 65hr | 100 |
| Ti,NH3 | 400 | 0 | – | – | – | – | YES | 525°C 65hr | 100 |

* NH3 plasma between Ti and TiN steps.

‡ In situ means that there was no exposure to atmosphere prior to NH3 plasma processing. Wafers are transported under vacuum.

*Fig. 1*

*Fig. 2* Ti/TiN/Al
*Fig. 3* Ti/TiN/NH₃ Plasma/Al

METHODS OF FORMING A BARRIER LAYER

This invention relates to methods for forming a barrier layer.

In the manufacture of semi conductor devices it is often necessary to deposit a barrier layer. This is frequently of Titanium or Titanium alloy and its purpose is generally to provide good adhesion to the surface layer and to avoid unintentional or undesirable alloying between the connection layer and the surface layer, in particular to avoid Aluminium alloy "spiking" through a contact junction. It is known that exposing the barrier layer to Oxygen can improve the mechanical qualities of the layer, but the Applicants have determined that this Oxygen is detrimental to the grain structure of Aluminium or its alloys when deposited on such a layer.

U.S. Pat. No. 5,552,341 describes an alternative process to a barrier layer to improve the subsequent Aluminium layer whereby a silylation layer is formed on the surface of the barrier layer by a plasma treatment using a silicon hydride. The barrier is improved by the known Oxygen treatment to stuff grain boundaries.

From one aspect the invention consists as a method of forming a barrier layer on a semiconductor surface comprising depositing a layer of Titanium Nitride, exposing the layer to Oxygen and nitriding at least the surface of the oxidised layer.

For convenience, for the purposes of this specification, such treatments of the barrier layer, whether or not they involve Oxygen will be known as reactivation.

The step of nitriding may be performed with a Nitrogen containing plasma. Additionally or alternatively, the barrier layer may be exposed to plasma-generated or U.V. atomic Hydrogen in the presence of Nitrogen to nitride any oxidised material in the barrier layer. Alternatively the removal of Oxygen by atomic Hydrogen and the nitriding step could be performed sequentially. With current apparatus, at least, nitriding in a pure Nitrogen atmosphere is difficult to achieve. The ratio of Hydrogen:Nitrogen may be between 1:10 and 3:1. The Hydrogen may be supplied in the form of $NH_3$, in which case the $NH_3$ may supply at least some of the nitriding Nitrogen.

The barrier layer essentially contains atoms of Titanium and Nitrogen however Titanium Nitride forms columnar grain structures that present grain boundaries running from top to bottom. As the Titanium Nitride is acting as a physical barrier this is an inherent defect but it is well known that it can be mitigated by the addition of Oxygen during the formation of Titanium Nitride, or the exposure of Titanium Nitride to Oxygen (e.g. through exposure to air). The Oxygen is said to "stuff" the grain boundaries.

It is thus preferential to have Oxygen additions to the Titanium nitride (to improve the barrier quality), however this presents a problem if the top surface contains some atomic Oxygen.

The effect of Oxygen contamination on TIN is that under typical conditions there will be an oxidised surface, which consists of oxygen atoms bonded to the outer layers of Titanium, which will come into intimate contact with the Aluminium and which are likely to form a chemical bond with it, thus inhibiting the flow or drifting of material in certain processes.

The use of Oxygen is thought to improve the barrier by blocking diffusion paths at grain boundaries or defect sites by a process known as 'oxygen stuffing'. This Oxygen may arrive at the barrier layer as part of a process step e.g. Nitrogen anneal where it is well known that some small quantity of Oxygen is present or an Oxygen plasma process or suchlike or as a secondary effect of exposure to atmosphere. The Nitrogen is essentially acting as a dilutant for Oxygen during the anneal process and does not usefully react with the layer during this process.

Only a very small quantity of Oxygen is required to effect some improvement in the mechanical properties of barrier layer. As Titanium Oxides are poor conductors the electrical qualities are not necessarily enhanced. Also the grain structure of the Aluminium is inferior if it deposited on a barrier containing oxygen at its surface.

From a further aspect the invention consists in a method of forming a barrier layer on the surface of a workpiece, for example a semi-conductor wafer, including depositing a layer of Titanium Nitride and subsequently exposing the surface of the layer to activated Nitrogen so that any free surface Titanium in the layer is nitrided to form Titanium Nitride.

Preferably the surface is exposed to energetic $NH_3$ and in particular to an $NH_3$ plasma. The TiN layer may be exposed to oxygen prior to the nitriding step and may additionally or alternatively be Oxygen annealed. There may be a vacuum break between the deposition of the Titanium Nitride layer and the nitriding step.

In particular, further experiments have determined that nitridation by an Ammonia plasma treatment improves the mechanical characteristics of the barrier even when no Oxygen exposure has taken place. Further as no Oxides are formed the process is not detrimental to the electrical characteristics.

This result is contrary to expectation and the teaching of the prior art.

The additional improvement of nitriding with Ammonia plasma treatments have been mentioned above.

The Applicants can only hypothesis at this time as to the precise mechanism which is involved. It has been observed that a TiN barrier is stronger than a TiN barrier with Ti deposited on top. A possible explanation is thus that the TiN barrier is weakened by having free Ti present. Oxygen exposure binds the free Ti forming Oxides of Titanium. Exposure of the barrier to Nitrogen heat treatment or an activated Nitrogen exposure, e.g. by Nitrogen containing plasma, appears to be as effective as Oxygen treatment because the free Ti has been bound as Titanium Oxides or Nitrides or TiN and not as previously taught by Oxygen 'stuffing grain boundaries' (see U.S. Pat. No. 5,552,341 e.g. column 4 lines 25 to 31 and lines 63 to 64 for an exposition of prior art to that invention and column 8 lines 26 to 31 showing that the use of an oxide in the barrier such that "the stuffing effect can be maintained" was still required for that invention).

The invention also includes a method of depositing a conductive layer, such as Aluminium, Aluminium alloy or Copper film, on a workpiece including initially depositing a barrier layer of Titanium Nitride, reactivating the barrier layer and depositing the conductive layer.

The barrier layer may be deposited using physical vapour deposition and may itself be laid down on a pure Titanium layer.

As has been set out in one aspect above, it has been found that barrier layers containing Oxygen can be made suitable for subsequent processing by replacing at least the surface Oxygen atoms with Nitrogen.

This has been achieved in a number of ways, in particular the use of Nitrogen and Hydrogen containing plasmas. An explanation of possible mechanisms is as follows.

The use of a Nitrogen containing plasma is probably explained by plasma generated species, possibly ion assisted, effectively nitriding the oxidised barrier surface.

$$TiO_2+N^* \rightarrow TiN+O_2$$

This reaction is only slightly favourable above 625° C.

The use of a plasma—or Ultra Violet-generated atomic Hydrogen is more chemically favourable and does not require ion assistance:

$$TiO_2+4H^* \rightarrow 2H_2O+Ti-485 \text{ KJ}$$

If this reaction is carried out in the presence of Nitrogen, the final barrier layer surface would be simultaneously nitrided.

Chemical Vapour Deposited (CVD) TiN has superior characteristics than Physically Vapour Deposited (PVD) TiN. However, there can be a vacuum break as the wafers are transported from the CVD equipment to the PVD equipment for the metallisation processes.

The oxidised Titanium at the surface is re-nitrided in the presence of atomic Hydrogen and atomic Nitrogen either from a mix of gasses or a single gas containing both Nitrogen and Hydrogen (and possibly other elements). The re-nitridation by a mix of atomic Hydrogen and Nitrogen predominately takes place by an initial reduction of the Titanium oxide by the Hydrogen, and then a reaction of the Titanium with the Nitrogen.

Increasing temperatures increases the reaction speed probably by increasing the speed with which the water by-product of the reduction process leaves the substrate surface and so reducing the possibility of reoxidising the surface $$TiN+2H_2O \rightarrow TiO_2+\frac{1}{2}N_2+2H_2$$

At these temperature atomic Hydrogen is thus the enabling reaction as it make available Titanium to react with the Nitrogen. Therefore in a Nitrogen containing ambient atmosphere as atomic Hydrogen concentration is increased from zero the rate of conversion of Titanium Oxide to Nitride increases.

There will naturally come a point where the nitriding of the reduced Titanium Oxide becomes the rate limiting reaction as there are a fixed number of gas molecules in any given volume at constant temperature and pressure.

There is thus an optimum mix of atomic Hydrogen and Nitrogen for this process when carried out at temperatures less than that enabling a direct reaction of Titanium Oxide to Titanium Nitride in the presence of atomic Nitrogen. The use of a gas molecule containing both Hydrogen and Nitrogen may be preferable to a mix of the two separate gases because more Hydrogen and Nitrogen atoms may be present in the fixed volume of gas at the substrate surface being reacted.

By way of example in the same volume, when completely dissociated:

$$N_2+H_2 \rightarrow 2N+2H$$

$$NH_3+NH_3 \rightarrow 2N+6H$$

Further it is well known that in a plasma a Nitrogen containing gas such as Ammonia may be a much more ready source of atomic Nitrogen than molecular Nitrogen. It is also believed that $NH_3$ as a vapour will "stick" to the substrate more readily than Hydrogen or Nitrogen liberating atomic Nitrogen and Hydrogen under energetic bombardment and thus promoting the required surface reactions.

An experimental result is that increasing molecular Nitrogen to Hydrogen gas concentrations up to 10:1 increases nitridation rates, yet this rate is still below that from the use of Ammonia with its 1:3 Nitrogen to Hydrogen atomic content. This is probably because the atomic Nitrogen generated from the molecular Nitrogen is the rate limiting factor.

It has also been observed that as the concentration of molecular Nitrogen in Hydrogen is increased still further beyond a certain point the rate of nitridation reduces yet is still not at the same rate as that from a compound of Nitrogen and Hydrogen such as Ammonia. A possible explanation is that Titanium Oxide reduction is now the limiting factor. Possibly the molecular Hydrogen has become so diluted in molecular Nitrogen that as atomic Hydrogen is formed it is physically precluded from reacting with the substrate surface as it is not in intimate enough contact with it due to the presence of a large number of (unreacted) Nitrogen molecules.

The invention may be performed in various ways and specific examples will now be described in which:

FIG. 1 is a table of results relating to Experiment 1;

FIG. 2 is a SEM of a via filled in accordance with one process; and

FIG. 3 is a SEM of via filled by another process

EXPERIMENT 1

A barrier and aluminium alloy layers were deposited onto a previously deposited silicon oxide layer containing holes on a silicon wafer. The holes thus expose the silicon wafer to the barrier layer. Various processes were carried out in a matrix as shown in the Results FIG. 1.

Each barrier was then tested to destruction by excessive thermal stress. The test results are derived by etching away the silicon oxide and deposited barrier and aluminium alloy layers and examining the silicon surface. If aluminium has spiked the barrier it is evidenced by its presence in the silicon wafer where the holes in the silicon oxide layer had been.

In this experiment, in addition to 'control' processes where no improvement would be expected, various Oxygen exposure techniques were carried out prior to the use of ammonia ($NH_3$) to plasma process a barrier layer. $NH_3$ was chosen as a suitable Nitrogen containing gas, but other Nitrogen containing gases or pure Nitrogen in conditions appropriate to allow Nitrogen to react with the barrier layer may be used.

The Oxygen exposure techniques consisted of:

Exposing the workpiece to atmosphere (vacuum break)

Oxygen anneal (heat treatment)

Nitrogen anneal (heat treatment) containing trace quantities of Oxygen

Oxygen plasma

Where these were carried out on a TiN barrier prior to treating with a Nitrogen containing plasma or other activated Nitrogen treatment (e.g. an ammonia plasma process) it would be expected that the wafers would show the best barrier characteristics due to the known 'oxygen stuffing' effect.

However, as can be seen from FIG. 1 an ammonia plasma, with no Oxygen treatment of the silicon wafer, offered the best barrier capability after 65 hours of thermal stress and this capability was similar to those of a wafer (after 24 hours thermal stress), which had been given atmospheric exposure followed by Oxygen plasma and ammonia plasma treatment. The latter is, as has been mentioned, electrically less suitable.

The absence of Oxygen from the treatment chamber has been tested and proven to the limits of sensitivity of the analysis. In any case both Oxygen exposures (vacuum break and Oxygen plasma) follow an expected trend with the combination of both exceeding the use either separately leading to the expectation that more Oxygen exposure yields a better barrier. Therefore even if there were traces of Oxygen present it would be expected that 'NH$_3$ plasma' wafer would be inferior to ones which had been exposed to larger quantities of Oxygen by atmospheric break, Oxygen plasma, Oxygen anneal or Nitrogen (with trace Oxygen) anneal.

Experimental Details

General Procedure

Test pieces consisting of Silicon wafers pieces with SiO$_2$ layer with holes had barrier layers deposited upon them using different barrier conditions and keeping the degas and aluminium steps constant. A control piece was always run to check machine continuity. The pieces were subjected to a range of furnace bakes to stress the barrier. Finally the deposited layers and SiO$_2$ were removed and the Silicon substrate inspected for signs of spiking.

Wafers and Test Structure

Test wafers (100 mm) containing large arrays of 1.3 µm diameter, 0.9 µm deep holes with a separation of 8.5 µm were used for all tests. Wafers were broken and pieces or splits of approximately 2 cm×1 cm used on the back of Silicon carriers.

Process Details

All wafers received the same degas and aluminium steps as follows:

Degas: 5 min, 3 kW

Al: 45 sec backfill cool, 1 µm, 6 kW, 200° C.

Control Barrier

The control barrier has thin layers of Ti and TiN because of the large hole size.

Ti: 100 Å, 6 kW, 400° C., 20 sccm Ar

TiN: 300 Å, 12 kW, 400° C., 20 sccm Ar, 70 sccm N2, 600 W bias

Shutter: 12 kW, 15 sec, 100 sccm Ar

Barrier Splits

FIG. 1 (results section) identifies barrier splits. Barrier splits tested had been processed by ammonia plasma, atmospheric exposure, Oxygen plasma, Nitrogen and Oxygen furnace anneals individually and in combinations, which were expected to yield good barrier performance.

Furnace Bake to Stress Barrier

Pieces from each run were broken and subjected to furnace temperatures of 525° C. for varying lengths of time in order to induce spiking and determine the relative strength of the barrier splits.

De-Processing

The degree of spiking can be established by removing the layers of deposition and dielectric and examining the Silicon substrate.

Spiking shows up as square or rectangular shaped holes. If no spiking has occurred, only the circular bases of the holes can be seen.

Etch Procedure 1. 5 min KOH to remove Al
2. 5 min Buffered HF 10% to attack TiN
3. 2 hour H$_2$O$_2$ to remove TiN
4. 1 hour Buffered HF 10% to remove SiO$_2$
5. 1 min propan-2-ol to clean wafer Optical Procedure The de-processed pieces were examined under the optical microscope using interference contrast mode. Photographs of typical areas of holes were taken and the percentage of holes spiked (% spiking), measured from the photographs.

Results

FIG. 1 shows each split in terms of treatments received and % spiking seen after a bake at 525° C. in a Nitrogen atmosphere. Further work is required to determine if he Oxygen furnace treatment is better than the insitu NH$_3$ plasma because as can be seen from FIG. 1 this split only received 24 hours of bake unlike all other splits that received 65 hours. Results are shown in order of barrier strength.

Discussion of Results

Barrier splits can be grouped as stronger or weaker than the standard Nitrogen furnace annealed process (containing residual Oxygen) equating to the well know 'grain boundary stuffing' prior art.

Stronger Than N2 Furnace

Ti/TiN/NH$_3$ plasma

Ti/TiN/Vacuum break/O$_2$ Furnace/NH$_3$ plasma

Ti/TiN/Vacuum break/NH$_3$ plasma

Ti/TiN/O$_2$ Plasma/NH$_3$ plasma

Weaker Than N2 Furnace

Ti/TiN

Ti/NH$_3$ plasma

Ti/NH$_3$ plasma/TiN

From these results the following observations can be made:

(a) The stronger barrier splits have post TiN NH$_3$ plasma treatments.

(b) NH$_3$ plasma is comparable to O$_2$ furnace treatments in combination with NH$_3$ plasma.

SEM Analysis of wafers processed with the TiN NH$_3$ Plasma

Wafers with higher aspect ratio holes (2:1) with a 300 Å Ti/750 Å TiN barrier were used to compare structural changes in TiN due to the NH$_3$ plasma process.

SEM analysis of TiN with and without NH$_3$ plasma does not reveal any obvious structural change in the field region.

On the walls of holes there is a difference in the Al/TiN interface. In the case of no NH$_3$ plasma large grains are seen near the hole walls (FIG. 2). These grains have been analysed before using TEM. The grains are possibly TiAl$_3$. For NH$_3$ plasma treated wafers the Al/TiN interface is well defined and no grains are seen (FIG. 3).

Mechanism For Barrier Strengthening

Results suggest that Ti in the TiN layer may be responsible for weakening the barrier.

Furnace treatments have the effect of passivating any free Ti by forming Titanium Oxides or Nitrides.

The fact that the TiN treated by NH$_3$ plasma barrier is comparable in strength to that of the combination of oxygen treatments and NH$_3$ plasma suggest that it is the presence of free Ti which has a greater effect on weakening the barrier rather than stuffing of vacancies in the columnar structure. Previous work has shown that Ti deposited on a Ti/TiN barrier reduces the strength of the barrier.

EXPERIMENT II

Experiment I was repeated on wafers having 1.2 µm wide×0.8 µm deep contact structures. A metal stack comprising 10 nmTi, 20 nm TiN and 100 nm Al 0.5% cu was deposited. The wafer was then baked at 500° C. for four hours, deprocessed back to Si and optical inspection of >10,000 holes completed. The results were as follows:

| Process | % Spiking |
| --- | --- |
| In situ NH₃ plasma | ≤1 |
| O₂ Furnace (450° C./45 mins) + NH₃ plasma | 5 |
| N₂ Furnace (450° C./45 mins) | 30 |
| In situ N₂ plasma | 35 |

The Applicants have further established that one surprising effect of the reactivation process may be to seed tightly textured aluminium or aluminium alloy <111> films. Such tight texturing of the aluminium alloys is normally associated with improved electromigration resistance, but historically the deposition of these aluminium alloy films on titanium nitride barriers had not resulted in tight texturing, indeed they are almost 2½ times as poor as such films deposited on titanium alone.

Tests to date suggest that this improvement is particularly dramatic where the barrier has been deposited by physical vapour deposition.

It has further been found that if the barrier is processed as set out above then surprisingly the preheat of the wafers need not be as hot.

Placing a workpiece previously in one gas ambient (e.g. atmosphere) into a vacuum or another gaseous ambient causes the workpiece to "outgas" as gas and vapour leave the surface and enter the vacuum or new gas ambient.

This outgassing is particularly undesirable in plasma processes as they are carried out in a partial vacuum consisting of a reduced pressure gas ambient chosen to be reactive in a specific way, or to be unreactive.

The lower the pressure of the process the more potentially deleterious the outgassing to the process as the outgassing will make up a greater proportion of the total gas present or may make the low pressure unachievable without increasing the vacuum pumping speed or will require increased pumping speed and thus expense.

In particular sputtering processes are carried out using an inert low pressure gas ambient typically argon. The argon gas is ionised in a flow discharge generally by applying a suitable negative voltage to an electrode thus providing a "feedstock" of ions which under the influence of the negative potential impact the electrode surface upon which is placed a target material. Target material is sputtered away by ion impact through the argon plasma ambient and onto the workpiece placed conveniently nearby.

Argon is frequently chosen because it is the most commercially attractive inert gas with a relatively massive ion.

However, if there are any potentially reactive gasses or vapour present in the argon ambient they will also be ionised by the glow discharge, becoming reactive and reacting with the sputtered material, either at the target surface, during the flight through the ambient gas or on another surface.

When deliberately chosen this process is known as "reactive sputtering" and is used to sputter such materials as titanium nitride where nitrogen is added to the inert sputtering feedstock. However, when this occurs in an uncontrolled manner, as a result of water vapour, nitrogen, oxygen and the other constituents of atmosphere then undesired oxides, nitrides and other materials are deposited or formed on the workpiece by reaction with the target material. This is particularly undesirable for Aluminium and its alloys because it increases resistivity. Therefore for sputtering processes outgassing is undesirable.

The main source of outgassing is the workpiece themselves as they are continually being placed into the process chamber having previously been in atmosphere or other gas environment (e.g. dry nitrogen). Outgassing is a time consuming process and any speeding up of this process is desirable. Well-known ways of speeding up this process are heat and UV, heating being practically universally employed. The greater the heat the faster the degassing.

However, wafers have a thermal budget and this use by preheating could be advantageously avoided.

What has been found by the Applicants is that wafers with barrier layers that have been reactivated require lower preheating temperatures for a number of processes. In the experiments so far conducted an ammonia plasma has been utilised for reactivation.

It is not known exactly why this result is achieved but it cannot simply be as a result of plasma "conditioning", heating or energetic bombardment of the wafter surface because in all cases the wafers are subjected to an argon (inert) plasma as part of the "sputter etch" process after preheating and prior to sputtering. The ammonia plasma process is in addition to and before the sputter etch process.

The reduction in preheat temperature should also eliminate any up extrusion of the underlying metal into the via.

Thus in some experiments preheat temperatures have been reduced from 550° C. to 350° C. if a reactivation step is included after Ti/TiN deposition.

What is claimed is:

1. A method of forming a barrier layer on a semiconductor surface said method comprising:

depositing a layer of titanium nitride on the semiconductor surface;

exposing the layer of titanium nitride to oxygen to form an oxidized layer; and nitriding at least a surface of the oxidized layer.

2. A method as claimed in claim 1, wherein said nitriding is performed using a nitrogen-containing plasma.

3. A method as claimed in claim 1, wherein said nitriding is performed by exposing the oxidized layer to plasma-generated or U.V. atomic hydrogen in the presence of nitrogen.

4. A method as claimed in claim 1, further comprising using atomic hydrogen to remove oxygen from the oxidized layer prior to said nitriding.

5. A method as claimed in claim 3, wherein a ratio of hydrogen:nitrogen is between 1:10 and 3:1.

6. A method as claimed in claim 3, wherein the hydrogen is supplied in the form of NH₃.

7. A method as claimed in claim 6, wherein the NH₃ supplies at least some nitrogen used for said nitriding.

8. A method of forming a barrier layer on the surface of a workpiece, said method comprising:

depositing a layer of titanium nitride on the surface of the workpiece; and exposing the surface of the titanium nitride layer to activated nitrogen so that any free surface titanium in the titanium nitride layer is nitrided to form the barrier layer.

9. A method as claimed in claim 8, wherein the surface of the titanium nitride layer is exposed to activated NH₃.

10. A method as claimed in claim 9, wherein the surface of the titanium nitride layer is exposed to an NH₃ plasma.

11. A method as claimed in claim 8, further comprising exposing the titanium nitride layer to oxygen prior to being exposed to activated nitrogen.

12. A method as claimed in claim 8, wherein the surface of the titanium nitride layer is oxygen annealed prior to being exposed to activated nitrogen.

13. A method as claimed in claim 8, further comprising a vacuum break between said depositing of the titanium nitride layer and said exposing the titanium nitride layer to activated nitrogen.

14. A method of depositing a conductive layer on a workpiece, said method comprising:

depositing a barrier layer of titanium nitride on the workpiece;

reactivating the barrier layer; and depositing a conductive material on the reactivated barrier layer.

15. A method as claimed in claim 14, wherein the barrier layer is deposited using physical vapour deposition.

16. A method as claimed in claim 15, wherein the barrier layer is deposited on a pure titanium layer.

17. A method as claimed in claim 14, wherein the barrier layer is reactivated using $NH_3$.

18. A method as claimed in claim 14, wherein the workpiece is a semi-conductor wafer.

19. A method as claimed in claim 18, further comprising outgassing the workpiece by preheating, prior to said depositing of the conductive material onto the barrier layer, to a temperature of no more than approximately 350° C.

* * * * *